US010964357B2

(12) United States Patent
Bringivijayaraghavan et al.

(10) Patent No.: US 10,964,357 B2
(45) Date of Patent: Mar. 30, 2021

(54) SKEWED SENSE AMPLIFIER FOR SINGLE-ENDED SENSING

(71) Applicant: Marvell Asia Pte. Ltd., Singapore (SG)

(72) Inventors: Venkatraghavan Bringivijayaraghavan, Cheyyar (IN); Anoop Delampady, Kasaragod (IN); Puneet Suri, Bengalure (IN)

(73) Assignee: Marvell Asia Pte., Ltd., Singapore (SG)

( * ) Notice: Subject to any disclaimer, the term of this patent is extended or adjusted under 35 U.S.C. 154(b) by 0 days.

(21) Appl. No.: 16/393,050

(22) Filed: Apr. 24, 2019

(65) Prior Publication Data
US 2020/0342918 A1 Oct. 29, 2020

(51) Int. Cl.
*G11C 7/06* (2006.01)
*G11C 7/08* (2006.01)
*G11C 7/12* (2006.01)
*G11C 11/412* (2006.01)
*G11C 11/419* (2006.01)

(52) U.S. Cl.
CPC .............. *G11C 7/067* (2013.01); *G11C 7/08* (2013.01); *G11C 7/12* (2013.01); *G11C 11/412* (2013.01); *G11C 11/419* (2013.01)

(58) Field of Classification Search
None
See application file for complete search history.

(56) References Cited

U.S. PATENT DOCUMENTS

| 5,926,413 | A | * | 7/1999 | Yamada | G11C 11/22 365/145 |
|---|---|---|---|---|---|
| 5,949,256 | A | | 9/1999 | Zhang et al. | |
| 7,764,532 | B2 | | 7/2010 | Kurjanowicz et al. | |
| 7,830,727 | B2 | | 11/2010 | Arsovski et al. | |
| 9,312,006 | B2 | | 4/2016 | Chang et al. | |
| 9,478,277 | B1 | * | 10/2016 | Liu | G11C 11/4091 |
| 9,564,184 | B2 | | 2/2017 | Barth, Jr. | |
| 9,589,604 | B1 | | 3/2017 | Fritsch et al. | |

(Continued)

OTHER PUBLICATIONS

Heselhaus et al., "A Sensing Circuit for Single-Ended Read-Ports of SRAM Cells with Bit-Line Power Reduction and Access-Time Enhancement," Advances in Radio Science, vol. 9, 2011, pp. 247-253.

(Continued)

*Primary Examiner* — J. H. Hur

(57) ABSTRACT

Disclosed is a skewed sense amplifier with data and reference sides. The data side has two or more series connected n-type field effect transistors (NFETs) between a data input/output node and a switch to a ground. The reference side has one or more series connected NFETs (but fewer than on the data side) between a reference input/output node and the switch. The data input/output node controls the NFET(s) on the reference side and vice versa. Due to a faster current flow rate through the reference side NFET(s) as compared to the data side NFETs, this amplifier is particularly suited for detecting when, at the initiation of a sensing process, the reference input/output node has a high voltage state and the data input/output node has either a high voltage state or a discharging voltage state. Also disclosed is a memory circuit that incorporates such amplifiers for single-ended read operations.

6 Claims, 9 Drawing Sheets

(56) References Cited

U.S. PATENT DOCUMENTS

| | | | |
|---|---|---|---|
| 2002/0180589 A1* | 12/2002 | Gabara | G06F 7/026 340/146.2 |
| 2004/0246800 A1* | 12/2004 | Genevaux | G11C 7/12 365/205 |
| 2006/0034130 A1* | 2/2006 | Liu | G11C 11/565 365/189.02 |
| 2014/0247077 A1* | 9/2014 | Singh | H03K 3/356104 327/199 |
| 2015/0206586 A1 | 7/2015 | Chang et al. | |

OTHER PUBLICATIONS

Kulkarni et al., "5.6 Mb/mm2 1R1W 8T SRAM Arrays Operating Down to 560 mV Utilizing Small-Signal Sensing With Charge Shared Bitline and Asymmetric Sense Amplifier in 14 nm FinFET CMOS Technology," IEEE Journal of Solid-State Circuits, vol. 52, No. 1, 2017, pp. 229-239.

Chandras et al., "Sensing Schemes of Sense Amplifier for Single-Ended SRAM," IEEE International Conference on Nextgen Electronic Technologies, 2017, pp. 379-384.

Wu et al., "Two-Port SRAM Cell with Improved Write Operation," International Journal of Information and Electronics Engineering, vol. 8, No. 3, 2018, pp. 41-45.

Arsovski et al., "Self-Referenced Sense Amplifier for Across-Chip-Variation Immune Sensing in High-Performance Content-Addressable Memories," IEEE, Custom Integrated Circuits Conference, 2006, pp. 1-4.

Mohan et al., "Match Line Sense Amplifiers with Positive Feedback for Low-Power Content Addressable Memories," IEEE, Custom Integrated Circuits Conference, 2006, pp. 297-300.

Elfreda et al., "A Comparative Study of Low-Power Cam Match-Line Sense Amplifier Designs," International Journal of Computer Applications (0975-8887), International Conference on Innovations in Intelligent Instrumentation, Optimization and Signal Processing, ICIIIOSP-2013, pp. 7-11.

* cited by examiner

| INPUTS | | OUTPUTS | |
|---|---|---|---|
| 315 | 325 | Q | $\overline{Q}$ |
| 0 | 1 | 1 | 0 |
| 1 | 0 | 0 | 1 |
| 1 | 1 | Q | $\overline{Q}$ |
| 0 | 0 | X | X |

FIRST MEMORY ARRAY ACTIVE AND SECOND MEMORY ARRAY INACTIVE

SECOND MEMORY ARRAY ACTIVE AND FIRST MEMORY ARRAY INACTIVE

SKEWED SENSE AMPLIFIER FOR SINGLE-ENDED SENSING

BACKGROUND

Field of the Invention

The present invention relates to sense amplifiers and, particularly, to a skewed sense amplifier, which can, for example, be incorporated into a multi-port memory circuit for single-ended sensing.

Description of Related Art

Multi-port static random access memory (MP-SRAM) arrays are SRAM arrays configured to allow the same memory cell or different memory cells to be accessed during the same clock cycle (i.e., during the same access period). Thus, MP-SRAM arrays have essentially twice the bandwidth of conventional single port static random access memory (SP-SRAM) arrays.

Depending on the specific configuration used for a MP-SRAM array, read operations may be single-ended or double-ended. For purposes of this disclosure, a single-ended operation employs only one bitline that is connected to all of the memory cells in a given column of memory cells within the MP-SRAM array. A double-ended operation employs two bitlines (referred to as a bitline pair or complementary bitlines) connected to all of the memory cells in the given column. Those skilled in the art will recognize that single-ended write operations are difficult to perform consistently without error and, thus, MP-SRAM arrays are typically configured to allow for double-ended write operations. The memory circuit design decision to employ either single-ended read operations or double-ended read operations typically involves trade-offs associated with chip area consumption, device and wiring density, circuit complexity, performance (e.g., sensing speed and accuracy), storage capacity, etc.

For example, memory arrays configured for double-ended write operations and single-ended read operations generally require three bitlines per column (i.e., one pair of bitlines for the double-ended write operations plus one read bitline for the single-ended read operations). During a single-ended read operation, a stored data value in a specific storage node in a selected memory cell at a given address (i.e., a given column and row) is read by sensing the change in voltage on the read bitline for the column and, particularly, by determining whether the read bitline, which has been pre-charged, is discharged or not following read wordline activation. The sensing process is typically performed using a single-input device, such as an inverter, a skewed logic gate, a domino logic gate or the like. It should be noted that a relatively large voltage change is required for such a single-input device to register the change in the voltage level on the read bitline. Thus, the single-ended read operation is referred to as a large signal sensing process.

Memory arrays configured for double-ended read operations and double-ended write operations generally require two pairs of bitlines per column of memory cells. During a double-ended read operation, a stored data value in a selected memory cell at a given address (i.e., a given column and row) is read by pre-charging a bitline pair for the column, activating the appropriate wordline, and sensing a voltage difference between a true bitline and a complement bitline in the bitline pair. The sensing process is typically performed using a two-input device and, particularly, a sense amplifier. It should be noted that two-input devices are capable of registering relatively small voltage differentials. Thus, the double-ended read operation is referred to as a small signal sensing process.

While memory arrays configured for double-ended write operations and single-ended read operations may seem preferable due to the lesser number of bitlines per column, the large signal sensing process associated with single-ended read operations can be problematic. Specifically, since a large voltage change is required for a single-input device to register a stored data value and since only a small voltage differential is required for a two-input device to register a stored data value, large signal processing is more time-consuming then small signal processing (i.e., the processing time required to sense a stored data value is greater with large signal processing). One technique that can be employed to reduce the processing time for single-ended read operations is to reduce the number of memory cells connected to each read bitline within each memory array in a memory circuit. However, while reducing the number of memory cells per bitline improves performance, it also either results in a corresponding decrease in the storage capacity of each memory array in the memory circuit or necessitates an increase in the number of memory arrays with the memory circuit (including an increase in the peripheral circuitry required to access those memory arrays). For example, consider a memory circuit with two memory banks, where each memory bank has two memory arrays and each memory array has 128 memory cells per bitline. If the number of memory cells per bitline in each memory array of each memory bank must be reduced to 32 to achieve the desired performance, then achieving the same storage capacity would also require an increase in the number of memory banks from two to eight.

SUMMARY

In view of the foregoing, disclosed herein are embodiments of a skewed sense amplifier. Each skewed sense amplifier can include a data side and a reference side. The data side can have two or more n-type field effect transistors (NFETs) connected in series between a data input/output node and a switch to a ground or negative voltage rail. The reference side can have one or more NFETs (but always a fewer number of NFETs than on the data side) connected in series between a reference input/output node and the switch. The data input/output node can control the NFET(s) on the reference side and vice versa. Due to a faster current flow rate through the reference side NFET(s) as compared to the data side NFETs, this skewed sense amplifier is particularly suited for detecting when, at the initiation of a sensing process, the reference input/output node has a high voltage state and the data input/output node has either a high voltage state or a discharging voltage state (i.e., is transitioning from high to low). Also disclosed herein are memory circuit embodiments that incorporate such skewed sense amplifiers for single-ended read operations (e.g., through a read only port). Specifically, in the disclosed memory circuit embodiments, instead of detecting a stored data value through a read only port using a single-input device (i.e., large signal sensing), the stored data value is detected using a two-input skewed sense amplifier (i.e., small signal sensing) by connecting the read bitline at issue in an active memory array to the data input/output node of the skewed sense amplifier and further connecting a corresponding read bitline in an adjacent inactive memory array to the reference input/output node. Since the disclosed memory circuit embodiments employ small signal sensing for single-ended read operations in multi-port memory arrays as opposed to large signal sensing, trade-offs between the number of memory cells per bitline and performance are avoided.

More particularly, disclosed herein are embodiments of a skewed sense amplifier with a first side (i.e., a data side) and a second side (i.e., a reference side). The first side can have two or more first n-type field effect transistors (i.e., first NFETs) connected in series between a data input/output node and a first terminal of a switch. The second side can have one or more second NFET(s) connected in series between a reference input/output node and the first terminal of the switch. The number of the first NFETs on the first side of the skewed sense amplifier can be greater than the number of the second NFET(s) on the second side. The gates of the first NFETs on the first side can be electrically connected to the reference input/output node so that the on/off state of each first NFET is controlled by the voltage level on the reference input/output node. Furthermore, the gate(s) of the second NFET(s) on the second side can be electrically connected to the data input/output node so that the on/off state of each second NFET is controlled by the voltage level on the data input/output node. The switch can have the first terminal, which, as discussed above is connected to both the first side and the second side. The switch can further have a second terminal, which is connected to a voltage rail and, particularly, to a ground rail or a negative voltage rail. This switch can be controlled by a sense amplifier set and can connect the voltage rail to the first side and the second side in order to initiate a sensing process or disconnect the voltage rail from the first side and the second side in order to end the sensing process. A latch can capture the voltage states of the data input/output node and the reference input/output node at the conclusion of the sensing process and output a digital output (Q).

A skewed sense amplifier with the above-discussed configuration can be particularly useful for detecting whether a data input has a high voltage state or a discharging voltage state. For example, prior to initiation of a sensing process, the data and reference input/output nodes of the skewed sense amplifier can be pre-charged to high voltage states (e.g., by an integrated pre-charge sub-circuit or by an external pre-charge circuit) and a data input with an unknown voltage state and a reference input with a high voltage state can be applied to the data input/output node and the reference input/output node, respectively. Subsequently, the switch can be turned on, thereby connecting the first side and the second side to the ground or negative voltage rail and initiating the sensing process. If both the data input/output node and the reference input/output node have high voltage states upon initiation of the sensing process, then the reference input/output node will be pulled down from the high voltage state to the low voltage state relatively quickly, causing all the first NFETs to turn off before the proximal first NFET in the series (i.e., the first NFET directly connected to the data input/output node) has turned on, thereby ensuring that the data input/output node will remain at the high voltage state. However, if the reference input/output node has a high voltage state, but the data input/output node has a discharging voltage state when the sensing process is initiated, then the data input/output node will be transitioning from the high voltage state to the low voltage state, the second NFET(s) will remain off and the reference input/output node will remain at the high voltage state, thereby allowing all the first NFETs to turn on and ensuring that the data input/output node is fully pulled down to the low voltage state.

Optionally, the above-described skewed sense amplifier can include an integrated pre-charge sub-circuit for pre-charging the data input/output node and the reference input/output node prior to initiation of the sensing process and/or a sense assist sub-circuit to boost the sensitivity of the sense amplifier.

Also disclosed herein are memory circuit embodiments that incorporate skewed sense amplifiers, as described above, to perform single-ended read operations through read only ports of multi-port memory arrays. Each of the memory circuit embodiments can include an integrated pair of memory banks (i.e., a first memory bank and a second memory bank). The first memory bank can include a first memory array with first read bitlines. The second memory bank can include a second memory array with second read bitlines. The first memory bank and the second memory bank can be alternately and selectively operable such that at any given time one of the first memory bank and the second memory bank is an active memory bank with an active memory array and a different one of the first memory bank and the second memory bank is an inactive memory bank with an inactive memory array. That is, whenever the first memory bank and first memory array therein are active, the second memory bank and second memory array therein will be inactive and vice versa.

Each of the memory circuit embodiments can further include a sensing circuit, which is between and operably connected to the first memory array and the second memory array. The sensing circuit can include multiple skewed sense amplifiers for performing sensing processes during single-ended read operations. Specifically, each skewed sense amplifier can include the various components described in detail above and can be connected to the first memory array and the second memory array in a manner that allows the skewed sense amplifier to perform a sensing process and, particularly, to receive a data input on its data input/output node from a read bitline in the active memory array, to receive a reference input on its reference input/output node from a corresponding read bitline in the inactive memory array, and to process the data input and the reference input in order to determine a stored data value within a selected memory cell that is connected to the read bitline in the active memory array.

The different memory circuit embodiments disclosed herein employ different techniques to ensure that, during such a sensing process, the data input applied to a data input/output node of a given skewed sense amplifier is supplied from the active memory array and to further ensure that the reference input applied to a reference input/output node of the given skewed sense amplifier is supplied from the inactive memory array. For example, in one memory circuit embodiment, this is achieved through the use of steering circuits. In another memory circuit embodiment, this is achieved through the use of pairs of skewed sense amplifiers.

More particularly, in one memory circuit embodiment disclosed herein the sensing circuit can include steering circuits for the skewed sense amplifiers, respectively. Each steering circuit for each skewed sense amplifier can include sets of switches that selectively connect one read bitline of the active memory array to the data input/output node and one corresponding read bitline in the inactive memory array to the reference input/output node. In this memory circuit embodiment, the sensing circuit can further include latches for the skewed sense amplifiers, respectively. Each latch for each skewed sense amplifier can capture the voltage states on the data input/output node and the reference input/output node upon completion of a sensing process and can output a digital output (Q). It should be noted that in this memory circuit embodiment the data and reference inputs are supplied indirectly to each skewed sense amplifier (via the steering circuit). Therefore, in order to ensure sufficient pre-charging of the data and reference input/output nodes prior to initiation of a sensing process, each skewed sense amplifier can include the optional integrated pre-charge sub-circuit.

In another memory circuit embodiment disclosed herein the sensing circuit can include pairs of skewed sense amplifiers for corresponding read bitlines in the first memory array and the second memory array. Specifically, each pair of skewed sense amplifiers can include a first skewed sense amplifier and a second skewed sense amplifier. The first skewed sense amplifier and the second skewed sense amplifier can both be connected to the same corresponding read bitlines in the first memory array and the second memory array. However, the connections to the data and reference input/output nodes can be reversed. That is, the first skewed sense amplifier can have a first data input/output node connected to the first read bitline in the first memory array and a first reference input/output node connected to a corresponding second read bitline in the second memory array, whereas the second skewed sense amplifier can have a second data input/output node connected to the second read bitline and a second reference input/output node connected to the first read bitline. Additionally, the first and second skewed sense amplifiers of a given pair can be alternately and selectively operable. Specifically, the first skewed sense amplifier of the given pair can be operable (i.e., active) only when the first memory array is the active memory array. The second skewed sense amplifier of the given pair can be operable (i.e., active) only when the second memory array is the active memory array. In this memory circuit embodiment, the sensing circuit can further include latches for the pairs of skewed sense amplifiers, respectively. Each latch for each pair of skewed sense amplifiers can capture the voltage states on the data input/output node and the reference input/output node of the active skewed sense amplifier upon completion of a sensing process and can output a digital output (Q). It should be noted that in this memory circuit embodiment the data and reference inputs are supplied directly to the skewed sense amplifiers (e.g., from read bitlines as opposed to from a steering circuit). Due to this direct connection, pre-charging of read bitlines prior to initiation of a read operation should result in sufficient pre-charging of the data and reference input/output nodes and the optional integrated pre-charge sub-circuit within the skewed sense amplifiers is not required.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, multi-port static random access memory (MP-SRAM) arrays are SRAM arrays configured to allow the same memory cell or different memory cells to be accessed during the same clock cycle (i.e., during the same access period). Thus, MP-SRAM arrays have essentially twice the bandwidth of conventional single port static random access memory (SP-SRAM) arrays. Furthermore, depending on the specific configuration used for a MP-SRAM array, read operations may be single-ended or double-ended. For purposes of this disclosure, a single-ended operation employs only one bitline that is connected to all of the memory cells in a given column of memory cells within the MP-SRAM array. A double-ended operation employs two bitlines (referred to as a bitline pair or complementary bitlines) connected to all of the memory cells in the given column. Those skilled in the art will recognize that single-ended write operations are difficult to perform consistently without error and, thus, MP-SRAM arrays are typically configured to allow for double-ended write operations. The memory circuit design decision to employ either single-ended read operations or double-ended read operations typically involves trade-offs associated with chip area consumption, device and wiring density, circuit complexity, performance (e.g., sensing speed and accuracy), storage capacity, etc.

Figure 1:
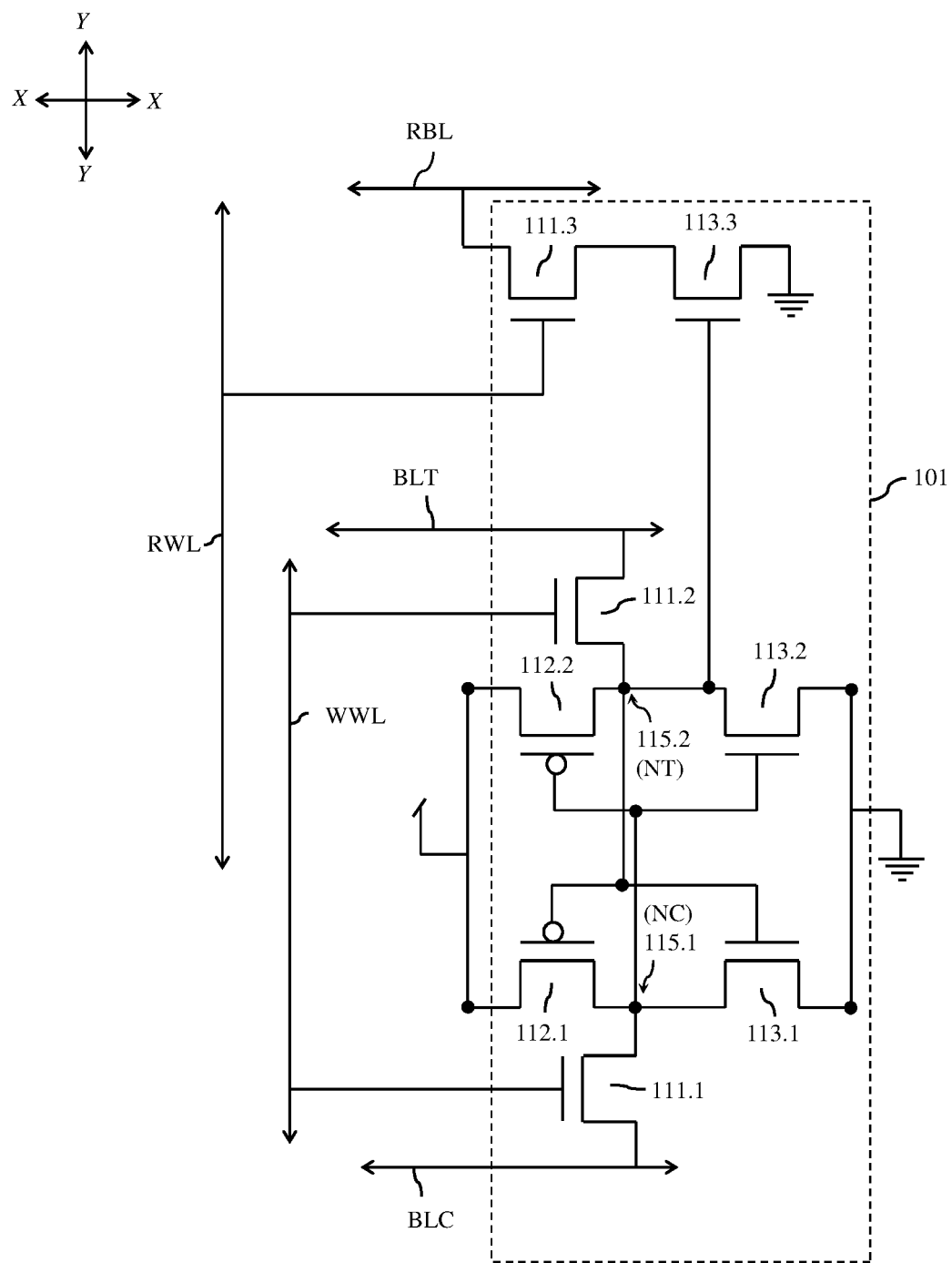
FIG. 1 is a schematic drawing illustrating a two-port static random access memory (2P-SRAM) cell.

FIG. 1 is a schematic diagram illustrating an exemplary MP-SRAM cell 101 (also referred to herein as a 2P-SRAM cell), which is configured for double-ended write operations (or, alternatively, double-ended read/write operations) through a first port (port A) and single-ended read operations through a second port (port B, referred to as a read only port). The 2P-SRAM cell 101 is an eight-transistor (8T) SRAM cell. It includes a pair of cross-coupled inverters. The cross-coupled inverters include a first inverter and a second inverter. The first inverter is connected between a positive voltage rail and a ground or negative voltage rail and includes a first pull-up transistor 112.1 connected in series to a first pull-down transistor 113.1. The second inverter is also connected between the positive voltage rail and the ground or negative rail and includes a second pull-up transistor 112.2 connected in series to a second pull-down transistor 113.2. In these cross-coupled inverters, a voltage level at a first storage node 115.1 (NC) at the interface between the first pull-up transistor 112.1 and the first pull-down transistor 113.1 controls the gates of second pull-up transistor 112.2 and the second pull-down transistor 113.2 and a voltage level at a second storage node 115.2 (NT) at the interface between the second pull-up transistor 112.2 and the second pull-down transistor 113.2 controls the gates of first pull-up transistor 112.1 and the first pull-down transistor 113.1.

In this 2P-SRAM cell 101, the first port (i.e., port A) can be a write only port for performing double-ended write operations only (or, alternatively, a read/write port for performing double-ended read or write operations). Specifically, a first pass-gate transistor 111.1 selectively connects a first bitline (referred to herein as the complement bitline (BLC)) of a pair of complementary bitlines to the first storage node 115.1 (NC) and a second pass-gate transistor 111.2 selectively connects a second bitline (referred to herein as the true bitline (BLT)) of the pair of complementary bitlines to the second storage node 115.2 (NT). The gates of the first pass-gate transistor 111.1 and the second pass-gate transistor 111.2 can be controlled by the same first wordline (referred to herein as the write wordline (WWL)). A double-ended write operation can be performed as follows. If a data value of "0" (i.e., a low data value) is to be written to the second storage node 115.2 (NT) (and, thus, a "1" on the first storage node 115.1 (NC)), then the BLC is pre-charged and the BLT is discharged. Next, WWL is activated to enable the first pass-gate transistor 111.1 and the second pass-gate transistor 111.2 and the data value "0" is stored on the second storage node 115.2 (NT). Contrarily, if a data value of "1" (i.e., a high data value) is to be written to the second storage node 115.2 (NT) (and, thus, a "0" on the first storage node 115.1 (NC)), the BLC is discharged and the BLT is pre-charged. Then, WWL is activated to enable the first pass-gate transistor 111.1 and the second pass-gate transistor 111.2 and the data value "1" is stored on the second storage node 115.2 (NT).

In this 2P-SRAM cell 101, the second port (i.e., port B) can be a read-only port for performing single-ended read operations to determine the stored data value (e.g., in the second storage node 115.2 (NT)). Specifically, an additional pass-gate transistor 111.3 and an additional pull-down transistor 113.3 can be electrically connected between an additional bitline (referred to herein as the read bitline (RBL)) and the ground or negative voltage rail. The gate of the read wordline (RWL)) and the gate of the additional pull-down transistor 113.3 can be controlled by the voltage level at the second storage node 115.2 (NT). A single-ended read operation can be performed by pre-charging RBL, activating RWL, and subsequently sensing a change in the voltage level on RBL and, particularly, sensing whether RBL is discharged or not (i.e., whether or not the voltage level on RBL drops from the pre-charged high voltage level to a low voltage level) following RWL activation. A stored data value of "1" at the second storage node 115.2 (NT) is indicated when the voltage level on RBL is discharged (i.e., drops from high to low) because both the additional pass-gate transistor 111.3 and the additional pull-down transistor 113.3 will turned on, thereby connecting RBL to the ground or negative voltage rail. A stored data value of "0" at the second storage node 115.2 (NT) is indicated when the voltage level on RBL remains at the pre-charged high voltage level because, although the additional pass-gate transistor 111.3 is turned on when the RWL is activated, the additional pull-down transistor 113.3 will remain off.

It should be noted that in the 2P-SRAM cell described above and illustrated in FIG. 1 the various pull-up transistors are p-type field effect transistors (PFETs) and the various pass-gate and pull-down transistors are n-type field effect transistors (NFETs).

In any case, as mentioned above, in prior art 2P-SRAM arrays this single-ended read operation has been performed using a single-input device, such as an inverter, a skewed logic gate, a domino logic gate or the like. Unfortunately, due to the relatively large voltage change required for such a single-input device to register the change in the voltage level on RBL, memory circuits with 2P-SRAM arrays typically limit the number of memory cells per bitline (e.g., to 32) within each 2P-SRAM array in order to improve performance (i.e., processing speed). However, while reducing the number of memory cells per bitline improves performance, it also either results in a corresponding decrease in the storage capacity of each memory array in the memory circuit or necessitates an increase in the number of memory arrays with the memory circuit (including an increase in the peripheral circuitry required to access those memory arrays). For example, consider a memory circuit with two memory banks, where each memory bank has two memory arrays and each memory array has 128 memory cells per bitline. If the number of memory cells per bitline in each memory array of each memory bank must be reduced to 32 to achieve the desired performance, then achieving the same storage capacity would also require an increase in the number of memory banks from two to eight.

In view of the foregoing, disclosed herein are embodiments of a skewed sense amplifier. Each skewed sense amplifier can include a data side and a reference side. The data side can have two or more n-type field effect transistors (NFETs) connected in series between a data input/output node and a switch to a ground or negative voltage rail. The reference side can have one or more NFETs (but always a fewer number of NFETs than on the data side) connected in series between a reference input/output node and the switch. The data input/output node can control the NFET(s) on the reference side and vice versa. Due to a faster current flow rate through the reference side NFET(s) as compared to the data side NFETs, this skewed sense amplifier is particularly suited for detecting when, at the initiation of a sensing process, the reference input/output node has a high voltage state and the data input/output node has either a high voltage state or a discharging voltage state (i.e., is transitioning from high to low). Also disclosed herein are memory circuit embodiments that incorporate such skewed sense amplifiers for single-ended read operations (e.g., through a read only port). Specifically, in the disclosed memory circuit embodiments, instead of detecting a stored data value through a read only port using a single-input device (i.e., large signal sensing), the stored data value is detected using a two-input skewed sense amplifier (i.e., small signal sensing) by connecting the read bitline at issue in an active memory array to the data input/output node of the skewed sense amplifier and further connecting a corresponding read bitline in an adjacent inactive memory array to the reference input/output node. Since the disclosed memory circuit embodiments employ small signal sensing for single-ended read operations in multi-port memory arrays as opposed to large signal sensing, trade-offs between the number of memory cells per bitline and performance are avoided.

Figure 2:
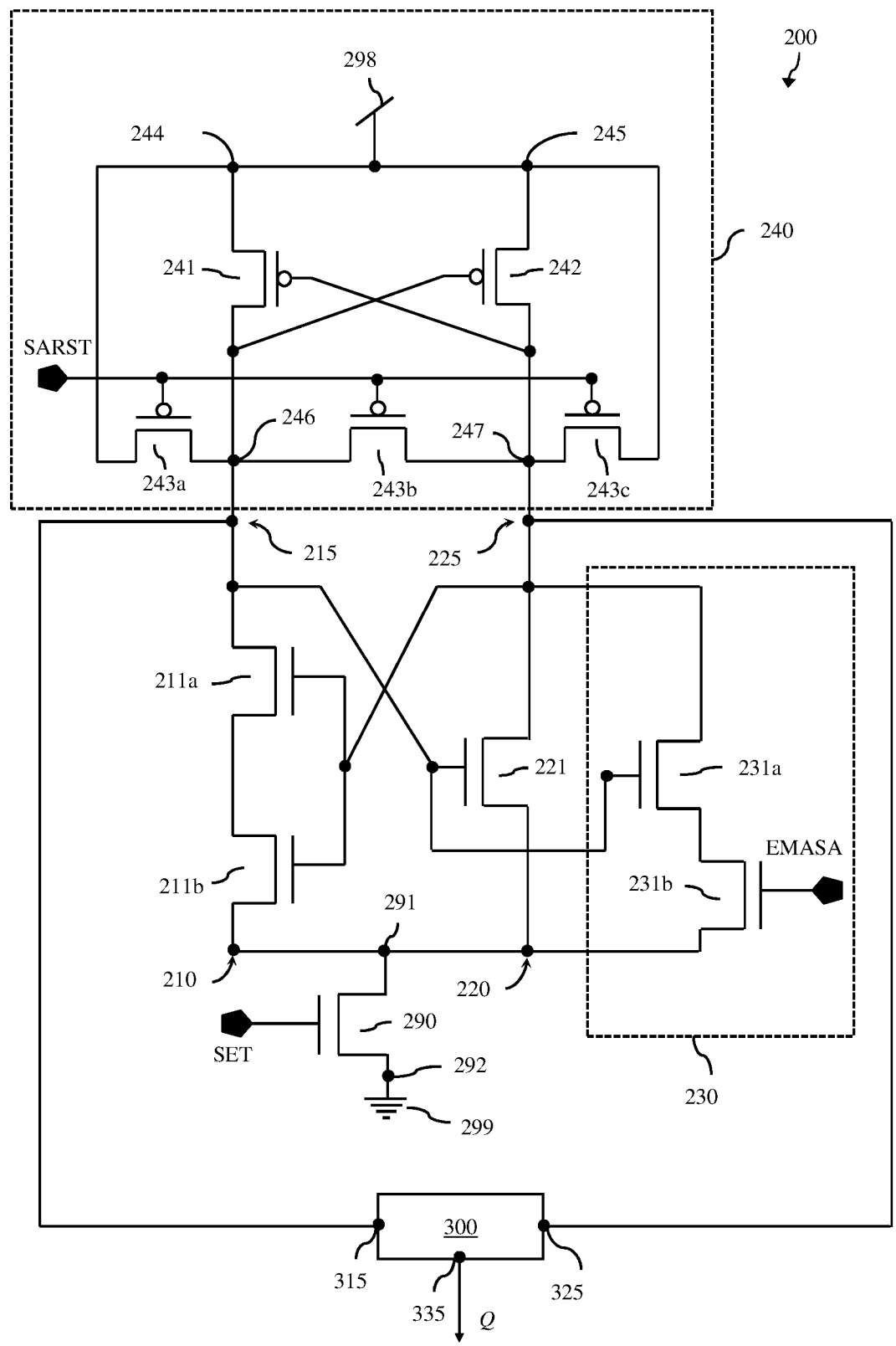
FIG. 2 is a schematic drawing illustrating an embodiment of a skewed sense amplifier with a connected latch.

More particularly, referring to FIG. 2, disclosed herein are embodiments of a skewed sense amplifier 200. The skewed sense amplifier 200 can have a first side (i.e., a data side) 210 and a second side 220 (i.e., a reference side). The first side 210 can have two or more first NFETs (e.g., see first NFETs 211*a*-211*b*) connected in series between a data input/output node 215 and a first terminal 291 of a switch 290. The second side 220 can have one or more second NFET(s) (e.g., see second NFET 221) connected in series between a reference input/output node 225 and the first terminal 291 of the same switch 290. As discussed in greater detail below, the first side 210 and the second side 220 are asymmetric with at least the number of first NFETs on the first side 210 being greater than the number of second NFET(s) on the second side 220 and, optionally, with the sizes of the first NFETs being different from the sizes of the second NFET(s). In any case, the gates of the first NFETs 211*a*-211*b* on the first side 210 can all be electrically connected to the reference input/output node 225 so that the on/off states of the first NFETs 211a-211b are controlled by the voltage level on the reference input/output node 225. Furthermore, the gate (s) of the second NFET(s) 221 can be electrically connected to the data input/output node 215 so that the on/off state(s) of the second NFET(s) are controlled by the voltage level on the data input/output node 215.

As mentioned above, each side 210, 220 can be connected to the first terminal 291 of the switch 290. The switch 290 can further have a second terminal 292 connected to a voltage rail 299 and, particularly, to a ground or negative voltage rail. The switch 290 can further be controlled by a sense amplifier set signal (SET) in order to connect the first side 210 and the second side 220 to the voltage rail 299 in order to initiate a sensing process and to disconnect the first side 210 and the second side 220 from the voltage rail 299 at the completion of the sensing process. The switch 290 can be, for example, an n-type field effect transistor (NFET) switch with the first terminal 291 being the drain region, the second terminal 292 being the source region and a gate that receives the SET signal. When SET is at a high voltage state (i.e., a logic value of "1"), the NFET switch 290 will turn on initiating the sensing process. When SET is at a low voltage state (i.e., a logic value of "0"), the NFET switch will turn off halting the sensing process. Alternatively, the switch 290 can be any other suitable type of switch.

The above-described skewed sense amplifier 200 has been designed to be particularly useful in detecting whether or not a data input is transitioning from a high voltage state to a low voltage state (i.e., whether or not the data input is maintaining a high voltage state or has a discharging voltage state), given a reference input with a high voltage state. In order to detect the voltage state of a data input during a sensing process, the data input/output node 215 and the reference input/output node 225 are pre-charged and the data input and reference input are applied to the data input/output node 215 and the reference input/output node 225, respectively, prior to turning on the switch 290 and initiating the sensing process.

Pre-charging of the data input/output node 215 and the reference input/output node 225 can be performed through an external source (not shown). Alternatively, the above-described skewed sense amplifier 200 can further include an optional integrated pre-charge sub-circuit 240 for pre-charging the data input/output node 215 and the reference input/output node 225 to high voltage states prior to initiation of a sensing process. An exemplary pre-charge sub-circuit 240 can include a first p-type field effect transistor (PFET) 241 on the first side 210 of the skewed sense amplifier 200 connected in series between a positive voltage rail 298 and the data input/output node 215. The pre-charged sub-circuit 240 can further include a second PFET 242 on the second side 220 of the skewed sense amplifier 200 connected in series between the positive voltage rail 298 and the reference input/output node 225. The gate of the first PFET 241 can be electrically connected to the drain of the second PFET 242 and the gate of the second PFET 242 can be electrically connected to the drain of the first PFET 241. This pre-charge sub-circuit can further include three series connected PFETs 243a-243c having a first end node 244 connected to a source of the first PFET 241, a second end node 245 connected to a source of the second PFET 242, and intermediate nodes 246, 247 connected to the drain of the first PFET 241 and the drain of the second PFET 242, respectively. The three-series connected PFETs 243a-243c can be controlled by a sense amplifier reset signal (SARST). Switching SARST to a low voltage state (i.e., a logic value of "0") initiates a pre-charge operation by turning on the series connected PFETs 243a-243c. When on, the PFETs 243a-243c pull up the voltage on the intermediate nodes 246 and 247 and thereby pull up the voltage on the data input/output node 215 and the reference input/output node 225, respectively. Switching SARST back to a high voltage state (i.e., a logic value of "1") ends the pre-charge operation. However, when the intermediate nodes 246 and 247 have high voltage states, the first PFET 241 and the second PFET 242 will be turned on and, as long as the switch 290 is turned off and data and reference inputs are stable, the data input/output node 215 and the reference input/output node 225 should remain pre-charged.

Some time after the data input/output node 215 and the reference input/output node 225 have been pre-charged and further some time after a data input and a reference input have been applied to the data input/output node 215 and the reference input/output node 225, respectively, the switch 290 can be turned on (i.e., by switching SET to "1"), thereby initiating the sensing process. If, upon initiation of the sensing process, the data input/output node 215 and the reference input/output node 225 both have high voltage states, then the high voltage states will be applied to the gates of the first NFETs 211a-211b and the second NFET(s) 221. If the first side 210 and the second side 220 of the sense amplifier were symmetric, the NFETs on both sides of the amplifier would turn on essentially concurrently and the data input/output node 215 and the reference input/output node 225 would both be pulled down such that little insight into the data input would be acquired. However, as mentioned above, the first side 210 and the second side 220 are asymmetric with at least the number of first NFETs being greater than the number of second NFET(s) and, optionally, with the sizes of the first NFETs and second NFET(s) being different. This asymmetry facilitates detection of the state of the data input.

Specifically, the higher number of first NFETs on the first side 210 and lower number of second NFET(s) on the second side 220 ensure that, in combination, the first NFETs are weaker than the second NFET(s) and, particularly, ensure that, when the high voltage states are concurrently applied to the gates of the first NFETs 211a-211b and the second NFET(s) 221 by the reference input/output node 225 and the data input/output node 215, respectively, a first current flow rate through the first NFETs 211a-211b will be slower than a second current flow rate through the second NFET(s) 221. As a result, the second NFET(s) 221 will turn on and pull down the voltage level on the reference input/output node 225 relatively quickly, thereby causing the first NFETs 211a-211b to turn off before the voltage level on the data input/output node 215 is pulled down.

For example, in the configuration illustrated, with two first NFETs 211a-211b and one second NFET 221, even though a high voltage state is applied to the gates of the first NFETs 211a-211b and the second NFET 221 at the same time, the proximal first NFET 211a closest to the data input/output node 215 will be in the sub-threshold range until after the distal first NFET 211b turns on and pulls down the source of the proximal first NFET 211a. In other words, the first NFETs are turned on in sequence (starting with the distal first NFET 211b) and not concurrently. The second NFET 221 will turn on before the proximal first NFET 211a and, as a result, will pull down the voltage level on the reference input/output node 225. The low voltage state on the reference input/output node 225 will then be applied to the gates of the first NFETs 211a-211b, thereby causing all the first NFETs 211a-211b to turn off prior to the proximal first NFET 211a ever turning on. Thus, the voltage level on the data input/output node 215 will not be pulled down and at the end of the sensing process (i.e., when SET switches to "0") the data input/output node 215 will retain the high voltage state and the reference input/output node 225 will have the low voltage state.

It should be noted that the different numbers of first NFETs on the first side 210 and second NFET(s) on the second side 220 can be predetermined to achieve the optimal current flow rate differential (i.e., an optimal difference between the first current flow rate and the second current flow rate). Optionally, the sizes of the first NFETs and the second NFET(s) can be different and the different sizes can be predetermined to further tune the current flow rate differential. For example, the two or more first NFETs 211a-211b on the first side 210 and the one or more second NFET(s) 221 on the second side 220 can all be fin-type field effect transistors (FINFETs), but the first NFETs and the second NFET(s) can have different numbers of semiconductor fins (nfins) and the different numbers of semiconductor fins can be predetermined to tune the current flow rate differential. Thus, for example, in one embodiment, the first side 210 can have two first NFETs 211a-211b, each having eight semiconductor fins and the second side 220 can have a single second NFET 221 with six semiconductor fins. In another embodiment, the first side 210 can have two first NFETs 211a-211b, each having twenty-four semiconductor fins and the second side 220 could have a single second NFET 221 with twelve semiconductor fins. Optionally, other features of the first NFETs and the second NFET(s) can be different and these differences can be predetermined to further tune the current flow rate differential. Those skilled in the art will recognize that the optimal different numbers and, optionally, the optimal different sizes or other features of the first NFETs and the second NFET(s) can be predetermined through simulation.

The above-discussion specifically addressed operation of the skewed sense amplifier 200 if, upon initiation of the sensing process (i.e., when SET switches to "1"), the data input/output node 215 and the reference input/output node 225 both had high voltage states. Contrarily, if upon the initiation of the sensing process (i.e., when SET switches to "1"), the data input/output node 215 has a discharging voltage state (i.e., is transitioning from high to low in response to the data input) and the reference input/output node 225 has the high voltage state, then the high voltage state on the reference input/output node 225 will work toward turning on the first NFETs 211a-211b, but the second NFET(s) 221 will remain off due to the discharging voltage state of the data input/output node 215. As a result, the reference input/output node 225 will remain at the high voltage state, thereby allowing all the first NFETs 211a-211b to turn on in sequence and ensuring that the data input/output node 215 is fully pulled down to the low voltage state. Thus, at the end of the sensing process (i.e., when SET switches to "0"), the data input/output node 215 will have the low voltage state and the reference input/output node 225 will have the high voltage state.

Optionally, the skewed sense amplifier 200 can further include a sense assist sub-circuit 230 for increasing the sense margin for detecting when the data input has the discharging voltage state. This sense assist sub-circuit 230 can include a third NFET 231a and an additional third NFET 231b connected in series between the reference input/output node 225 and the first terminal 291 of the switch 290. The gate of the third NFET 231a can be connected to the data input/output node 215 and the gate of the additional third NFET 231b can be controlled by an enable signal (EMASA). When EMASA is high, then the NFET 231b will be turned on, thereby creating a parallel path between the reference input/output node 225 and ground through NFET switch 290. As a result, the current flow rate on the reference side 220 of the skewed sense amplifier 200 is increased and the voltage level on the reference input/output node 225 will drop faster to assist in sensing the discharging voltage on the data input/output node 215.

The above-described skewed sense amplifier 200 can further be latched and, more particularly, can be connected to a latch 300 for capturing the different voltage states on the data input/output node 215 and the reference input/output node 225 at the end of the sensing process and for outputting a digital output (Q) indicative of the data input to the skewed sense amplifier 200. Specifically, the latch 300 can have a data input node 315 electrically connected to the data input/output node 215 of the skewed sense amplifier 200, a reference input node 325 electrically connected to the reference input/output node 225 of the skewed sense amplifier 200, and a data output node 335. The latch 300 can be configured so that the digital output (Q) at the output node 335 either switches or remains the same depending upon the voltage states on the data input/output node 215 and the reference input/output node 225 of the skewed sense amplifier 200. Specifically, if, at the end of the sensing operation, the voltage level at the data input node 315 (i.e., applied by the data input/output node 215) has switched to low (i.e., a logic value of "0") and the voltage level at the input node 325 (i.e., applied by the reference input/output node 225) has remained high (i.e., a logic value of "1"), then Q at the output node 335 will be high (i.e., a logic value of "1"). Contrarily, if, at the end of the sensing operation, the voltage level at the data input node 315 (i.e., applied by the data input/output node 215) has remained high (i.e., a logic value of "1") and the voltage level at the input node 325 (i.e., applied by the reference input/output node 225) has switched to low (i.e., a logic value of "0"), then Q at the output node 335 will be low (i.e., a logic value of "0"). Otherwise the voltage level at the data input node 315 (i.e., applied by the data input/output node 215) and the voltage level at the reference input node 325 (i.e., applied by the reference input/output node 225) will both be high (i.e., logic values of "1") and Q at the output node 335 will remain the same (i.e., will not switch).

Figures 3A, 3B:
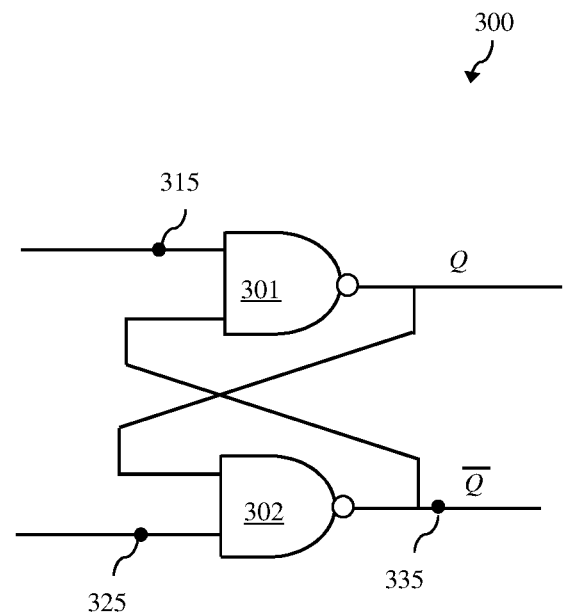
FIGS. 3A and 3B are a schematic drawing illustrating an exemplary latch and a truth table for the latch, respectively.

FIG. 3A is a schematic diagram illustrating an exemplary latch 300 that can be incorporated into the disclosed embodiments. As illustrated, this exemplary latch 300 is a conventional SR NAND latch with a pair of cross-coupled NAND logic gates 301 and 302. Inputs to the NAND logic gate 301 can be: (A) the voltage level at the data input node 315 (i.e., applied by the data input/output node 215) and (B) the digital output (Q) from the NAND logic gate 302. Inputs to the NAND logic gate 302 can be (A) the voltage level at the reference input node 325 (i.e., applied by the reference input/output node 225) and (B) the digital output (Q) from the NAND logic gate 301. FIG. 3B is a truth table indicating digital outputs (Q) and (Q) of the latch 300 as a function of the different voltage states on the date and reference inputs nodes 315 and 325. Since, prior to any sensing process performed by the skewed sense amplifier 200, the voltage levels on the data input/output node 215 and the reference input/output node 225 are pre-charged high and since at the end of each sensing operation, the voltage level on only one of these nodes 215 and 225 will be discharged, the inputs at the data and reference input nodes 315 and 325 to the latch 300 will never both be logic values of "0".

The latch 300 described above and shown in FIG. 3A is provided for illustration purposes and is not intended to be limiting. Alternatively, any other suitable latch structure could be employed as long as the structure is configured to capture the voltage states on the data input/output node 215 and the reference input/output node 225 of the skewed sense amplifier 200 at the end of the sensing process, to compare the different voltage states, and to output a digital output (Q) that indicates which of the two voltage states has switched to low and which remains high.

Referring to FIGS. 4A-4B and 5A-5B, also disclosed herein are embodiments of a memory circuit 400 and 500, respectively. This memory circuit 400, 500 includes multiple two-port static random access memory (2P-SRAM) arrays, which employ two-input skewed sense amplifiers, such as the skewed sense amplifier 200 described in detail above and illustrated in FIG. 2, to perform small signal sensing of read bitlines instead of employing single-input devices to perform large signal sensing of the read bitlines. Thus, the memory circuit 400, 500 avoids the need to limit the number of memory cells per bitline (e.g., to 32) as seen with conventional 2P-SRAM arrays.

More particularly, the disclosed memory circuit 400, 500 can include at least one integrated pair of memory banks (i.e., a first memory bank 491, 591 and a second memory bank 492, 592). The first memory bank 491, 591 can include a first memory array 481, 581 and, optionally, an additional first memory array 481', 581'. The second memory bank 492, 592 can include a second memory array 482, 582 and, optionally, an additional second memory array 482', 582'.

Each of these memory arrays can be a 2P-SRAM array, which includes columns and rows of 2P-SRAM cells (e.g., see the 2P-SRAM cells 101 described in detail above and illustrated in FIG. 1), which is configured for double-ended operations (e.g., write only or read/write) through a first port (port A), and which is further configured for single-ended read only operations through a second port (port B, referred to herein as a read-only port). Each of these 2P-SRAM arrays can be essentially identical and, particularly, can have the same number of 2P-SRAM cells 101 per column (e.g., 128) and the same number of 2P-SRAM cells 101 per row (e.g., 80).

As with any conventional 2P-SRAM array, all of the 2P-SRAM cells 101 in each column in the first memory array 481, 581 (and in the additional first memory array 481', 581', if included) can be connected to first complementary bitlines (BLC, BLT) for the port A double-ended operations and also to a first read bitline (RBL) 471, 571 for the port B single-ended read-only operations. Additionally, all of the 2P-SRAM cells 101 in each row of the first memory array 481, 581 (and in the additional first memory array 481', 581', if included) can be connected to two first wordlines: one for the port A double-ended operations and one for the port B single-ended read-only operations. Similarly, all of the 2P-SRAM cells 101 in each column in the second memory array 482, 582 (and in the additional second memory array 482', 582', if included) can be connected to second complementary bitlines (BLC, BLT) for the port A double-ended operations and also to a second read bitline (RBL) 472, 572 for the port B single-ended read-only operations. Additionally, all of the 2P-SRAM cells 101 in each row of the second memory array 482, 582 (and in the additional second memory array 482', 582', if included) can be connected to two second wordlines: one for the port A double-ended operations and one for the port B single-ended read-only operations.

It should be noted that, for purposes of illustration, the figures show the columns of memory cells oriented in the X direction (i.e., horizontally across the drawing sheets) and the rows of memory cells oriented in the Y direction (i.e., vertically across the drawing sheets). It should be understood that, alternatively, the columns of memory cells and read bitlines could be oriented in the Y direction and the rows of memory cells and wordlines could be oriented in the X direction. Furthermore, as discussed above, the present invention is directed to the use of skewed sense amplifiers 200 used for performing single-ended read only operations. Therefore, in order to avoid clutter and enable the reader to better focus on the salient aspects of the 2P-SRAM arrays within the disclosed memory circuit embodiments, the complementary bitlines employed for port A double-ended operations as well as all the wordlines have been omitted from the memory circuit embodiment figures and only the read bitlines (RBLs) 471, 571 are shown connected to the 2P-SRAM cells 101 in each 2P-memory array.

In any case, within the memory circuit 400, 500 the first memory bank 491, 591 can be positioned adjacent to the second memory bank 492, 592 such that the columns of 2P-SRAM cells 101 and the first read bitlines 471, 571 of the first memory array 481, 581 (and, if applicable, the additional first memory array 481', 581') are aligned with the columns of 2P-SRAM cells 101 and the second read bitlines 472, 572 in the second memory array 482, 582 (and, if applicable, the additional second memory array 482', 582'). Additionally, within the memory circuit 400, 500, the first memory array 481, 581 can be positioned adjacent to the additional first memory array 481', 581' (if included) such that the rows of 2P-SRAM cells 101 and corresponding wordlines in the first memory array 481, 581 are essentially aligned with the rows of 2P-SRAM cells 101 and corresponding wordlines in the additional first memory array 481', 581'. Similarly, within the memory circuit 400, 500, the second memory array 482, 582 can be positioned adjacent to the additional second memory array 482', 582' such that the rows of 2P-SRAM cells 101 and corresponding wordlines in the second memory array 482, 582 are essentially aligned with the rows of 2P-SRAM cells 101 and corresponding wordlines in the additional second memory array 482', 582'.

As mentioned above, the memory banks 491-492, 591-592 can be integrated. That is, they can share controller(s) 402, 502 and at least some of the other peripheral circuitry configured to enable multi-port access to selected 2P-SRAM cells 101 within each of the memory arrays 481-482, 581-582 (and within each the additional memory arrays, if included) in response to control signals from the controller(s) 402, 502. The memory banks 491-492, 591-592 can further be alternately and selectively operable (in response to control signals from the controller(s) 402, 502) such that at any given time one of the first memory bank and the second memory bank is an active memory bank with active memory array(s) and a different one of the first memory bank and the second memory bank is an inactive memory bank with inactive memory array(s). That is, whenever the first memory bank 491, 591 and first memory array(s) therein are active, the second memory bank 492, 592 and second memory array(s) therein will be inactive and vice versa.

Shared peripheral circuitry within the memory circuit 400, 500 between the first memory bank 491, 591 and the second memory bank 492, 592 can include shared column address decode logic and bitline drivers 405, 505 for selecting columns and appropriately biasing bitlines during port A and port B operations in either the first memory array 481, 581 or the second memory array 482, 582, depending upon which of the two memory banks is active. The shared peripheral circuitry can also include a shared sensing circuit 403, 503. As illustrated, the shared column address decode logic and bitline drivers 405, 505 as well as the shared sensing circuit 403, 503 can be positioned between the first memory array 481, 581 and the second memory array 482, 582. The shared peripheral circuitry can also include shared input/output buffers 401, 501 and shared global read bitlines 450, 550 that communicate digital outputs (Q) from the skewed sense amplifiers 200 in the shared sensing circuit 403, 503 to the shared input/output buffers 401, 501. Similar shared peripheral circuitry (e.g., shared column address decode logic and bitline drivers 405', 505', a shared sensing circuit 403', 503', shared input/output buffers 401', 501' and shared global read bitlines 450', 550') can be included for the additional first memory array 481', 581' and the additional second memory array 482', 582'.

Additional peripheral circuitry within the memory circuit 400, 500 can include row address decode logic and wordline drivers 441, 541 for selectively activating wordlines during port A and port B operations in the first memory array 481, 581. If an additional first memory array 481', 581' is included in the first memory bank 491, 591, the row address decode logic and wordline drivers 441, 541 can be positioned between and shared by the two first memory arrays. Additional peripheral circuitry can also include row address decode logic and wordline drivers 442, 542 for selectively activating wordlines during port A and port B operations in the second memory array 482, 582. If an additional second memory array 482', 582' is included in the second memory bank 492, 592, the row address decode logic and wordline drivers 442, 542 can be positioned between and shared by the two second memory arrays.

Excluding the shared sensing circuit 403, 503 (and, if applicable, the shared sensing circuit 403', 503') that is described in greater detail below, the above-described peripheral circuitry for 2P-SRAM arrays is well known in the art and, thus, the details thereof have been omitted from this specification in order to allow the reader to focus on the salient aspects of the disclosed memory circuit 400, 500.

The shared sensing circuit 403, 503 can be between and operably connected to the first memory array 481, 581 and the second memory array 482, 582. The shared sensing circuit 403, 503 can include multiple skewed sense amplifiers, such as the skewed sense amplifiers 200 described in detail above and illustrated in FIG. 2, and these skewed sense amplifiers 200 can be employed by the sensing circuit 403, 503 for performing sensing process during single-ended read operations in the first memory array 481, 581 or the second memory array 482, 582 depending upon which of the first memory bank 491, 591 and the second memory bank 492, 592 is currently active. Specifically, each skewed sense amplifier 200 within the shared sensing circuit 403, 503 can include the various components described in detail above and shown in FIG. 2 and can be connected to both the first memory array 481, 581 and the second memory array 482, 582 in a manner that allows that skewed sense amplifier 200 to perform a sensing process and, particularly, to receive a data input on its data input/output node from a read bitline in the active memory array (i.e., from a read bitline in either the first memory array or the second array, whichever is active), to receive a reference input on its reference input/output node from a corresponding read bitline in the inactive memory array, and to process the data input and the reference input in order to determine a stored data value within a selected 2P-SRAM cell 101 that is connected to the read bitline in the active memory array.

In the embodiments of the memory circuit 400, 500, which are illustrated in FIGS. 4A-4B and 5A-5B and described herein, the reference input that is applied to the reference input/output node 225 of the skewed sense amplifier 200 within the sensing circuit 403, 503 is a high voltage reference input supplied from a corresponding read bitline in the inactive memory array. For purposes of this disclosure, corresponding read bitlines in the active memory array and the inactive memory array are read bitlines associated with the same column (i.e., the first column, the second column, etc.) in both the active memory array and the inactive memory array. Using the corresponding read bitline in the inactive memory array to supply the high voltage reference input to the skewed sense amplifier ensures that the load on the data input and the reference input is essentially the same and, thus, improves sensing accuracy. However, it should be understood that, alternatively (although not shown), the high voltage reference input to the reference input/output node of the skewed sense amplifier 200 in a memory circuit could supplied by some alternative high voltage reference source.

In any case, in the embodiments of the memory circuit 400, 500 described herein, a single-ended read operation to determine a stored data value in a selected 2P-SRAM cell 101 that is connected to a particular read bitline for a particular column in the active memory array can be performed, as follows, in response to control signals from the controller(s) 402, 502. The exemplary process steps are described below with respect to a single ended-read operation being performed when the first memory bank 491 and the first memory array(s) therein are active and when the second memory bank 492, 592 and the second memory array(s) therein are inactive. The read bitline 471, 571 at issue in the active first memory array 481, 581 and the corresponding read bitline 472, 572 in the inactive second memory array 482, 582 can both be pre-charged to a high voltage state. Additionally, within the skewed sense amplifier 200, which will be receiving a data input from the read bitline 471, 571 on the data input/output node 215 and a reference input from the corresponding read bitline 472, 572 on the reference input/output node 225, both the data input/output node 215 and the reference input/output node 225 can also be pre-charged. Pre-charging of the data input/output node 215 and the reference input/output node 225 within a skewed sense amplifier 200 can be accomplished through an integrated pre-charge sub-circuit 240 within the skewed sense amplifier itself (e.g., see the discussion below regarding the skewed sense amplifiers within the sensing circuit 403 of the memory circuit 400 of FIG. 4) or, if applicable, via direct connection to the pre-charged read bitlines (see the discussion below regarding the skewed sense amplifiers within the sensing circuit 503 of the memory circuit 500 of FIG. 5).

Next, the read wordline (RWL) in the active memory array 481 and connected to the selected 2P-SRAM cell 101 can be activated, a data input from the read bitline 471, 571 in the active first memory array 481, 581 can be applied to the data input/output node 215 of the skewed sense amplifier 200, and a reference input (always a high voltage state) from the corresponding read bitline 472, 572 of the inactive second memory array 482, 582 can be applied to the reference input/output node 225 of the skewed sense amplifier 200. As discussed above with regard to 2P-SRAM cell 101 operation, a stored data value within a 2P-SRAM cell 101 at the second storage node 115.2 (NT) can be determined based on whether the read bitline (RBL) (in this example the first read bitline 471, 571) is discharged or not (i.e., whether or not the voltage level on RBL drops from the pre-charged high voltage level to a low voltage level) following activation of RWL. A stored data value of "1" at the second storage node 115.2 (NT) is indicated when the voltage level on RBL is discharged (i.e., drops from high to low) because both the additional pass-gate transistor 111.3 and the additional pull-down transistor 113.3 will turned on, thereby connecting RBL to the ground or negative voltage rail. A stored data value of "0" at the second storage node 115.2 (NT) is indicated when the voltage level on RBL remains at the pre-charged high voltage level because, although the additional pass-gate transistor 111.3 is turned on when the RWL is activated, the additional pull-down transistor 113.3 will remain off. It should be noted that the reference input from the inactive memory array is always a high voltage reference input because the corresponding read bitline 472, 572 in the inactive memory array is pre-charged and no accompanying RWL activation is performed within the inactive memory array 482, 582. However, when the voltage level on the read bitline 471, 571, which is connected to the data input/output node 215, is discharged (i.e., drops from high to low) upon activation of RWL, the voltage state of the data input/output node 215 will also be discharged, whereas when the voltage level on a read bitline 471, 571 remains high following activation of RWL, then the voltage state of the data input/output node 215 will also remain high.

In any case, some period of time after the data input is applied to the data input/output node 215 from the read bitline 471, 571 and the reference input is applied to the reference input/output node 225 from the corresponding read bitline 472, 572, the switch 290 of the skewed sense amplifier 200 is turned on (i.e., in response to SET switching to "1"), thereby initiating the sensing process within the skewed sense amplifier 200. The time period between activation of RWL and turning on of the switch 290 should be a predetermined time period sufficient for the skewed sense amplifier 200 to detect the occurrence of any change in the voltage level on the read bitline 471, 571. As mentioned above, upon initiation of the sensing process (i.e., by turning on the switch 290), the reference input/output node 225 will have a high voltage state and the data input/output node 215 will have either the high voltage state (e.g., indicating a stored data value of "0" at the storage node 115.2 (NT) in the selected 2P-SRAM cell 101) or a discharging voltage state (e.g., indicating a stored data value of "1" at the storage node 115.2 (NT) in the selected 2P-SRAM cell 101).

Within the skewed sense amplifier 200, the two or more first NFETs 211a-211b and the one or more second NFETs 221 enable detection of the high voltage state or the discharging voltage state of the data input/output node 215. Specifically, if upon initiation of the sensing process, the reference input/output node 225 and the data input/output node 215 both have high voltage states, then the high voltage state is applied to the gates of the first NFETs 211a-211b and the second NFET(s) 221. As a result of the difference between the slower first current flow rate through the first NFETs 211a-211b and the faster second current flow rate through the second NFET(s) 221, the reference input/output node 225 will be pulled down to a low voltage state relatively fast causing the first NFETs 211a-211b to turn off and ensuring that the data input/output node 215 remains at the high voltage state and a stored data value of logic "0" at the storage node 115.2 (NT) of the selected memory cell 101 is indicated. However, if upon the initiation of the sensing process, the reference input/output node 225 has the high voltage state and the data input/output node 215 has the discharging voltage state, then the high voltage state is applied to the gates of the first NFETs 211a-211b only and the discharging voltage state is applied to the gate(s) of the second NFET(s) 221. As a result, the second NFET(s) 221 is/are not turned on but the first NFET(s) 211a-211b are such that data input/output node 215 is pulled down to the low voltage state and the reference input/output node remains at the high voltage state, thereby indicating a stored data value of logic "1" at the storage node 115.2 (NT) of the selected memory cell 101.

It should be noted that, optionally, the skewed sense amplifiers 200 in the sensing circuit 403, 503 can include a sense assist sub-circuit 230, as discussed above and illustrated in FIG. 2, for increasing the sense margin for detecting when the data input has the discharging voltage state. It should also be noted that each skewed sense amplifier within the sensing circuit 403, 503 can be connected to a latch, such as the latch 300 described above and illustrated in FIG. 3. The digital output (Q) of the latch 300 can be communicated by a corresponding global read bitline 450, 550 to input/output buffers 401, 501.

The different embodiments of the memory circuit 400 and 500 disclosed herein employ different techniques to ensure that, during a sensing process performed by a given skewed sense amplifier 200 within the sensing circuit 403, 503, the data input applied to the data input/output node 215 of the given skewed sense amplifier 200 is supplied from whichever one of the first and second memory array is currently the active memory array and to further ensure that the reference input applied to a reference input/output node 225 of the given skewed sense amplifier 200 is supplied from the other memory array (i.e., the inactive memory array). For example, in the embodiment of the memory circuit 400 shown in FIGS. 4A-4B, this is achieved through the use of steering circuits 490. Alternatively, in the embodiment of the memory circuit 500 shown in FIGS. 5A-5B, this is achieved through the use of pairs of skewed sense amplifiers.

Figure 4A:
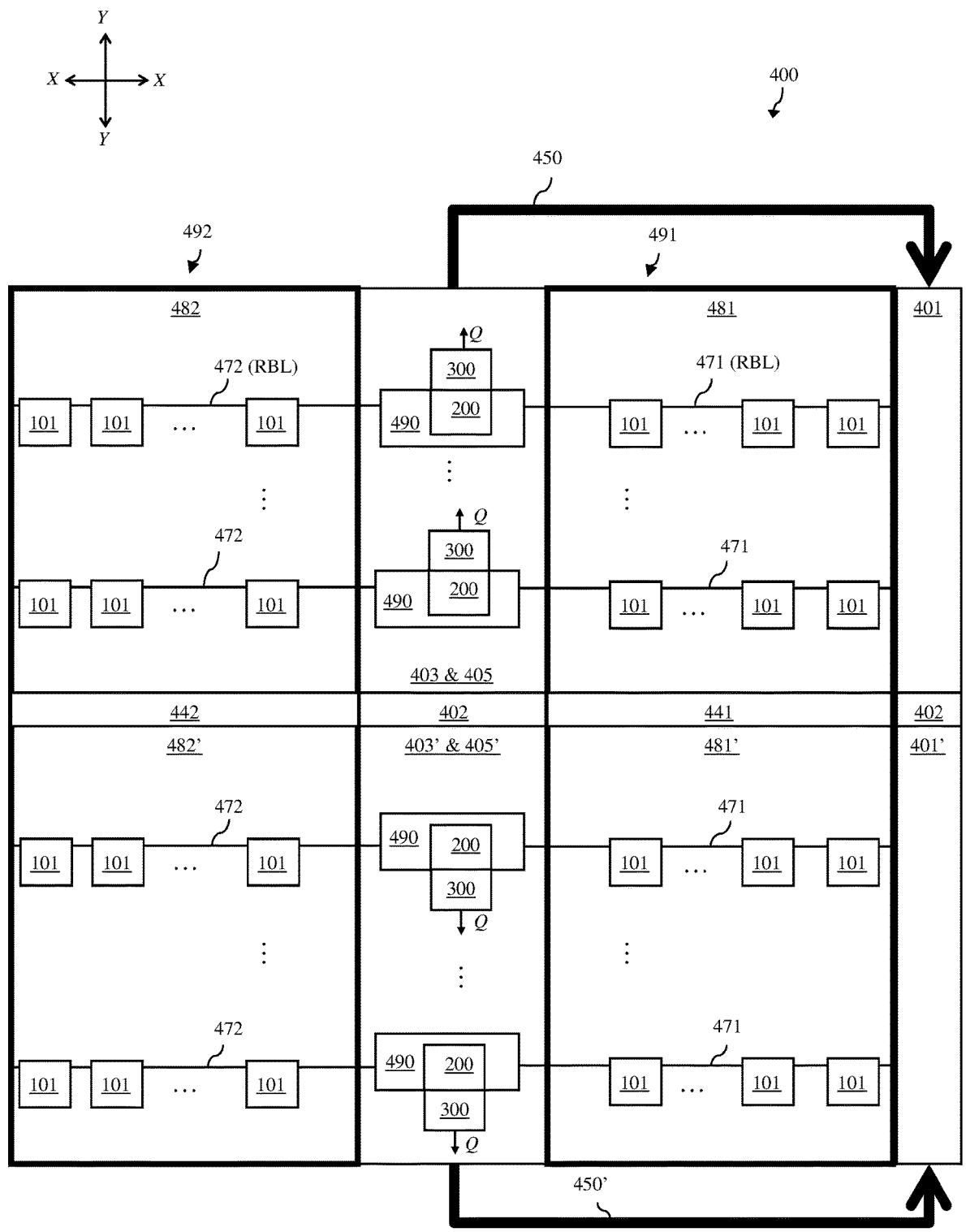
FIGS. 4A-4B is a schematic drawing illustrating an embodiment of a memory circuit incorporating skewed sense amplifiers.
Figure 4B:
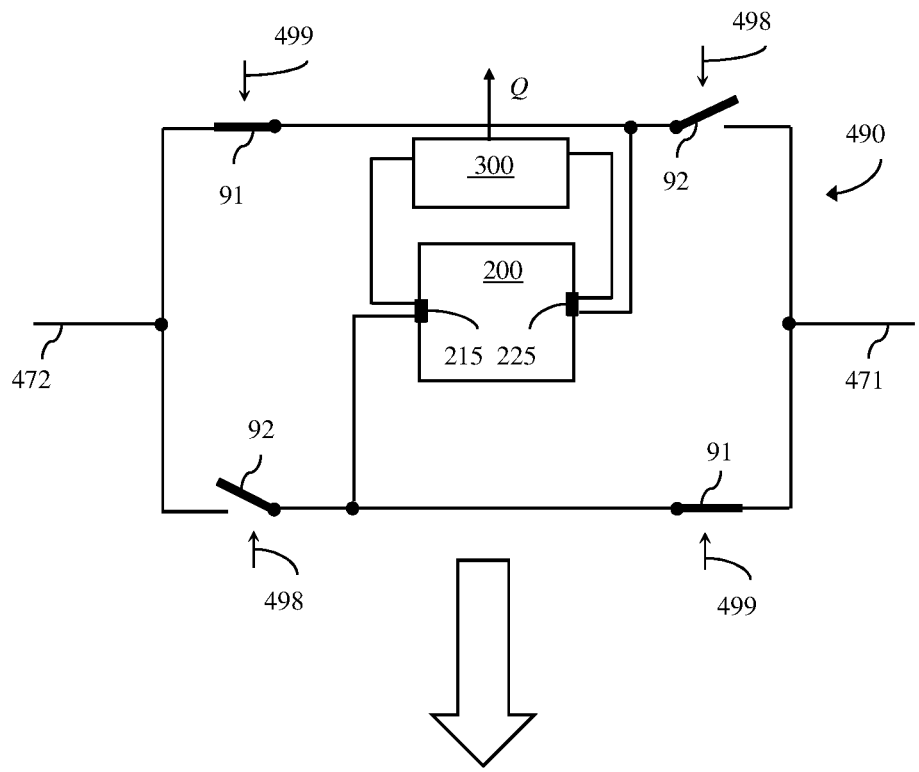

More particularly, referring to FIGS. 4A-4B, in the memory circuit 400, the sensing circuit 403 can include steering circuits 490 for the skewed sense amplifiers 200, respectively. As illustrated, particularly, in FIG. 4B, each steering circuit 490 for each skewed sense amplifier 200 can include sets of switches and, particularly, a first set of two switches 91 controlled by a first steering signal 499 and a second set of two switches 92 controlled by a second steering signal 498. In response to the steering signals 499, 498, these switches 91, 92 can selectively connect the read bitline of the active memory array to the data input/output node 215 of the skewed sense amplifier 200 and the corresponding read bitline in the inactive memory array to the reference input/output node 225. Since steering is dependent upon which of the two memory banks 491-492 is active, it should be understood that the steering signals will be derived from the control signals that activate one memory bank over the other. In one exemplary embodiment, the switches 91-92 can all be p-type field effect transistor (PFET) switches and the second steering signal 498 can be inverted relative to the first steering signal 499. In this case, the first steering signal 499 will go low and the second steering signal 498 will go high when the first memory bank 491 is the active memory bank such that the first memory array 481 is also active. As a result, the first switches 91 will turn on and the second switches 92 will turn off, thereby selectively connecting a first read bitline 471 of the active first memory array 481 to the data input/output node 215 and a corresponding second read bitline 472 in the inactive second memory array 482 to the reference input/output node 225. Furthermore, the first steering signal 499 will go high and the second steering signal 498 will go low when the second memory bank 492 is the active memory bank such that the second memory array 482 is also active. As a result, the first switches 91 will turn off and the second switches 92 will turn on, thereby selectively connecting the first read bitline 471 of the now inactive first memory array to the reference input/output node 225 and the corresponding second read bitline in the now active second memory array 482 to the data input/output node 215.

Figure 6:
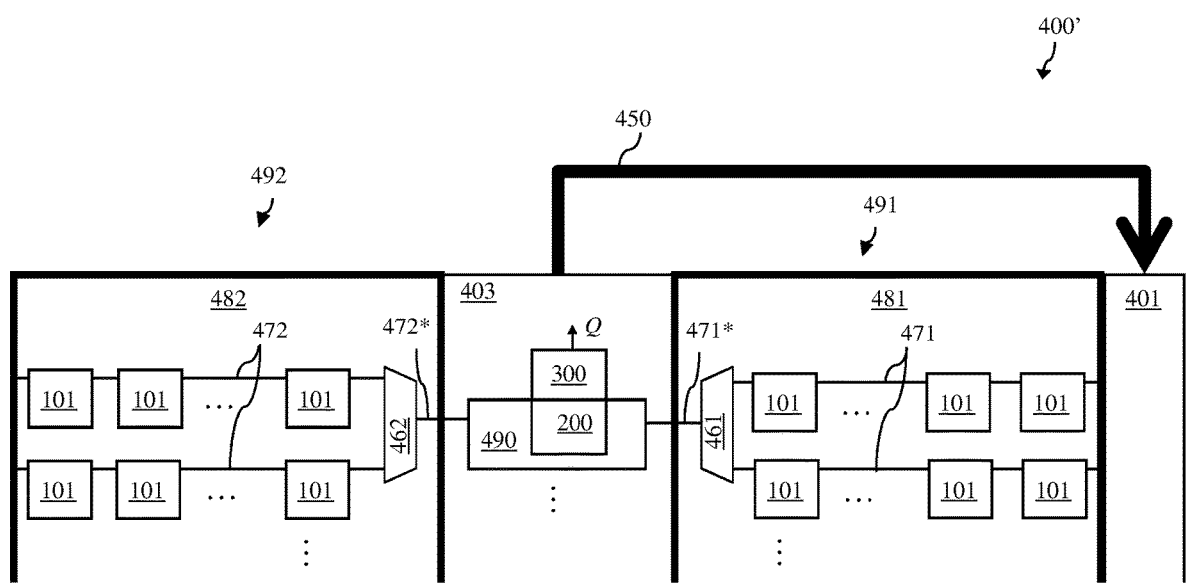
FIG. 6 is a schematic drawing illustrating an alternative configuration for the embodiment of the memory circuit shown in FIGS. 4A-4B.

It should be noted that, within the sensing circuit 403, a steering circuit 490 and corresponding skewed sense amplifier 200 can be connected to each of the corresponding pairs of read bitlines 471 and 472 from the first memory array 481 and the second memory array 482, as shown in the memory circuit 400 and illustrated in FIG. 4A. Alternatively, within the sensing circuit 403, each steering circuit 490 and corresponding skewed sense amplifier 200 can be selectively connected by multiplexors 461-462 to one of a group of first read bitlines 471 in the first memory array 481 and to one of a group of second read bitlines 472 in the second memory array 482, as shown in the alternative memory circuit 400' of FIG. 6. Specifically, the first memory array 481 can include first multiplexors 461. Each first multiplexor 461 can be connected to a group of the first read bitlines 471 (e.g., a group of 1, 2 or 4 first read bitlines) and, in response to control signals, can selectively connect a selected first read bitline 471* to one side of a steering circuit 490 for a skewed sense amplifier 200. Similarly, the second memory array 482 can include second multiplexors 462. Each second multiplexor 462 can be connected to a group of the second read bitlines 472 (e.g., a group of 1, 2 or 4 second read bitlines) and, in response to control signals, can selectively connect a selected second read bitline 472* to the opposite side of the same steering circuit 490.

In any case, in the memory circuit 400 (or 400') the sensing circuit 403 can further include latches for the skewed sense amplifiers 200, respectively. Each latch can be configured, for example, essentially the same as the latch 300 described above and illustrated in FIG. 3. Specifically, in the sensing circuit 403, each latch 300 can be connected to one skewed sense amplifier 200 and, at the completion of a sensing process (e.g., when either the voltage level on the data input/output node 215 or the voltage level on the reference input/output node 225 switches from high to low), can capture the different voltage states on the data input/output node 215 and the reference input/output node 225 and can output a digital output (Q) at the output node 335 indicating which has switched and thereby indicating the stored data value in a selected memory cell 101. More specifically, each latch 300 can have input nodes 315 and 325 connected to a data input/output node 215 and a reference input/output node 225, respectively, of a skewed sense amplifier 200 and an output node 335 that outputs a digital output (Q) indicating a stored data value at the second storage node 115.2 (NT) of a selected memory cell 101 connected via a RBL to the skewed sense amplifier 200. If the stored data value at the second storage node 115.2 (NT) of the selected memory cell 101 is a logic value of "1", then as a result of a sensing operation in the skewed sense amplifier 200 and latching by the latch 300 for that skewed sense amplifier, the voltage level on the data input/output node 215 will be pulled low so that a logic "0" is input to the data input node 315, the voltage level on the reference input/output node 225 will remain high so that a logic value of "1" is input to the reference input node 325 and the digital output (Q) at the output node 335 will be a logic value of "1" (i.e., Q will reflect the stored data value in the selected memory cell). Contrarily, if the stored data value at the second storage node 115.2 (NT) of the selected memory cell 101 is a logic value of "0", then as a result of a sensing operation in the skewed sense amplifier 200 and latching by the latch 300 for that skewed sense amplifier, the voltage level on the data input/output node 215 will remain high so that a logic "1" is input to the data input node 315, the voltage level on the reference input/output node 225 will be discharged so that a logic "0" is input to the reference input node 325, and the digital output (Q) will be a logic "0" (i.e., Q will reflect the stored data value in the selected memory cell). Otherwise (i.e., when the voltage levels on both the data input/output node 215 and the reference input/output node 225 are high), the digital output (Q) will remain unchanged. The digital output (Q) of the latch 300 can be communicated by a corresponding global read bitline 450 to input/output buffers 401.

It should be noted that in this embodiment of the memory circuit 400 (or 400') the data and reference inputs are supplied indirectly to each skewed sense amplifier 200 (via the steering circuit 490). Therefore, each skewed sense amplifier 200 within the sensing circuit 403 can further include an integrated pre-charge sub-circuit 240, as described above and illustrated FIG. 2, to ensure sufficient pre-charging of the data input/output node 215 and reference input/output node 225 prior to initiation of a sensing process.

Figure 5A:
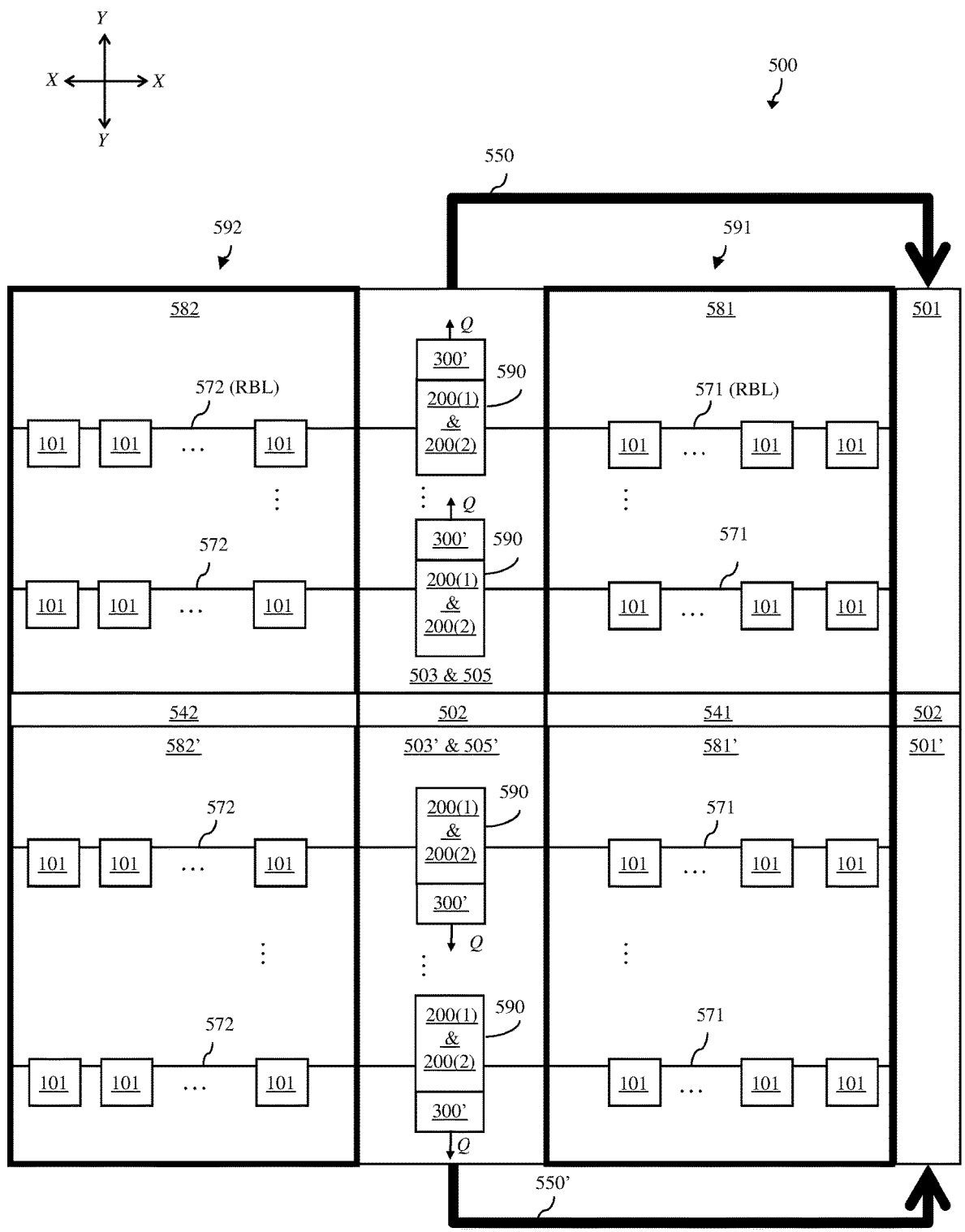
FIGS. 5A-5B is a schematic drawing illustrating another embodiment of a memory circuit incorporating skewed sense amplifiers.
Figure 5B:
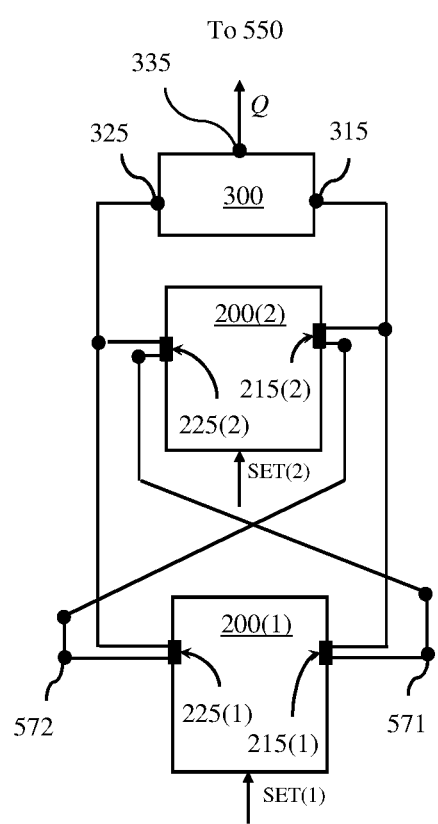

Referring to FIGS. 5A-5B, in the embodiment of the memory circuit 500 the sensing circuit 503 can include pairs 590 of skewed sense amplifiers for corresponding read bitlines in the first memory array 581 and the second memory array 582. Specifically, each pair 590 of skewed sense amplifiers can include a first skewed sense amplifier 200(1) and a second skewed sense amplifier 200(2). Both the first skewed sense amplifier 200(1) and the second skewed sense amplifier 200(2) can be configured as described in detail above and illustrated in FIG. 2. As illustrated in FIG. 5B, in this sensing circuit 503, the first skewed sense amplifier 200(1) and the second skewed sense amplifier 200(2) can both be connected to the same corresponding read bitlines 571 and 572 in the first memory array 581 and the second memory array 582, respectively. However, the connections to the data and reference input/output nodes can be reversed. That is, the first skewed sense amplifier 200(1) can have a first data input/output node 215(1) connected to the first read bitline 571 in the first memory array 581 and a first reference input/output node 225(1) connected to a corresponding second read bitline 572 in the second memory array 582, whereas the second skewed sense amplifier 200(2) can have a second data input/output node 215(2) connected to the second read bitline 572 and a second reference input/output node 225(2) connected to the first read bitline 571. The first skewed sense amplifier 200(1) and the second skewed sense amplifier 200(2) of a given pair 590 can be alternately and selectively operable. Specifically, the first skewed sense amplifier 200(1) can be operable (i.e., active) only when the first memory bank 591 and the first memory array(s) therein are active. The second skewed sense amplifier 200(2) can be operable (i.e., active) only when the second memory bank 592 and the second memory array(s) therein are active. Since operation of the skewed sense amplifiers 200(1)-200(2) in a given pair is dependent upon which of the two memory banks 591-592 is active, it should be understood that the SET signals (i.e., SET(1) and SET(2), respectively) for the different skewed sense amplifiers 200(1) and 200(2) will be sense amplifier-specific SET signals, will not be concurrently high, and will be derived from the control signals that activate one memory bank over the other.

Figure 7:
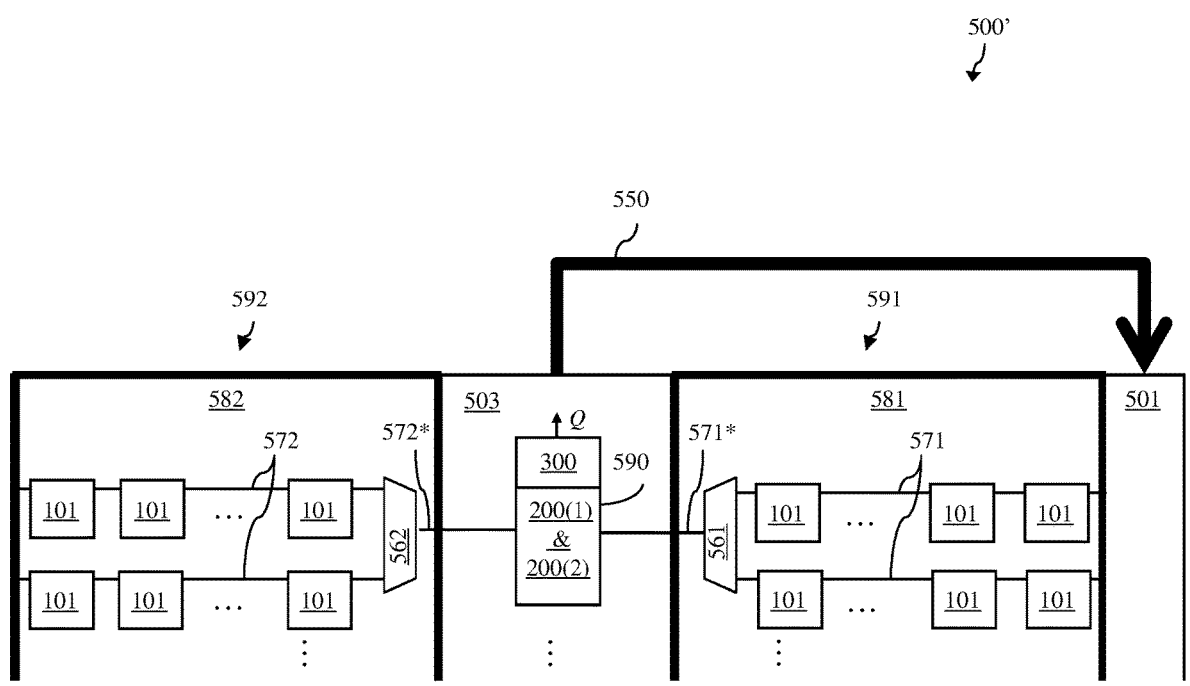
FIG. 7 is a schematic drawing illustrating an alternative configuration for the embodiment of the memory circuit shown in FIGS. 5A-5B.

It should be noted that, within the sensing circuit 503, a pair 590 of skewed sense amplifiers 200(1)-200(2) can be connected to each corresponding pair of read bitlines 571 and 572 from the first memory array 581 and the second memory array 582, as shown in the memory circuit 400 and illustrated in FIG. 4A. Alternatively, within the sensing circuit 503, each pair 590 of skewed sense amplifiers 200(1)-200(2) can be selectively connected by multiplexors 561-562 to one of a group of first read bitlines 571 in the first memory array 581 and to one of a group of second read bitlines 572 in the second memory array 582, as shown in the alternative memory circuit 500' of FIG. 7. Specifically, the first memory array 581 can include first multiplexors 561. Each first multiplexor 561 can be connected to a group of the first read bitlines 571 (e.g., a group of 1, 2 or 4 first read bitlines) and, in response to control signals, can selectively connect a selected first read bitline 571* to the data input/output node 215(1) of the first skewed sense amplifier 200(1) of a pair 590 and to the reference input/output node 225(2) of the second skewed sense amplifier 200(2) in the same pair 590. Similarly, the second memory array 582 can include second multiplexors 562. Each second multiplexor 562 can be connected to a group of the second read bitlines 572 (e.g., a group of 1, 2 or 4 first read bitlines) and, in response to control signals, can selectively connect a selected second read bitline 572* to the data input/output node 215(2) of the second skewed sense amplifier 200(2) of the pair 590 and to the reference input/output node 225(1) of the first skewed sense amplifier 200(1) of the pair 590.

In any case, in the memory circuit 500 (or 500') the sensing circuit 503 can further include latches 300 for the pairs of skewed sense amplifiers, respectively. It should be noted that the latches 300 can be configured essentially the same as the latches 300 described in detail above and shown in FIG. 3. However, in this case, for a given pair of skewed sense amplifiers, the data input node 315 of the latch 300 is connected to both the data input/output node 215(1) of the first skewed sense amplifier 200(1) and the data input/output node 215(2) of the second skewed sense amplifier 200(2) and the reference input node 325 of the latch 300 is connected to both the reference input/output node 225(1) of the first skewed sense amplifier 200(1) and the reference input/output node 225(2) of the second skewed sense amplifier 200(2). As mentioned above, the two skewed sense amplifiers 200(1) and 200(2) in any given pair 590 are selectively operable. Thus, the digital output (Q) of the latch 300 will indicate the stored data value at the second storage node 115.2 (NT) of a selected memory cell 101 in an active memory array and connected via a RBL to the active one of the two skewed sense amplifiers 200(1) or 200(2), which is performing a sensing operation. So, if the stored data value at the second storage node 115.2 (NT) of the selected memory cell 101 in the active memory array is a logic "1", then as a result of a sensing operation in the active skewed sense amplifier 200(1) or 200(2) and latching by the latch 300 for the pair of skewed sense amplifiers, the voltage level on the data input/output node of the active skewed sense amplifier will be pulled low so a logic value of "0" is input to the data input node 315, the voltage level on the reference input/output node of the active skewed sense amplifier will remain high so a logic value of "1" is input to the reference input node 325 and the digital output (Q) at the output node 335 will be a logic value of "1" (i.e., Q will reflect the stored data value in the selected memory cell in the active memory array). Contrarily, if the stored data value at the second storage node 115.2 (NT) of the selected memory cell 101 in the active memory array is a logic "0", then as a result of a sensing operation in the active skewed sense amplifier 200(1) or 200(2) and latching by the latch 300 for the pair of skewed sense amplifiers, the voltage level on the data input/output node of the active skewed sense amplifier will remain high so that a logic value of "1" is input to the data input node 315, the voltage level on the reference input/output node will be discharged so that a logic value of "0" is input to the reference input node 325 and the digital output (Q) at the output node 335 will be a logic value of "0" (i.e., Q will reflect the stored data value in the selected memory cell in the active memory array). Otherwise and, particularly, when the voltage levels on the data input/output nodes 215(1) and 215(2) and the reference input/output nodes 225(1) and 225(2) of both skewed sense amplifiers are pre-charged high and neither skewed sense amplifier is performing a sensing operation, the digital output (Q) at the output node 335 of the latch 300 will remain unchanged. The digital output (Q) of the latch can be communicated by a corresponding global read bitline 550 to input/output buffers 501.

Figure 4B:
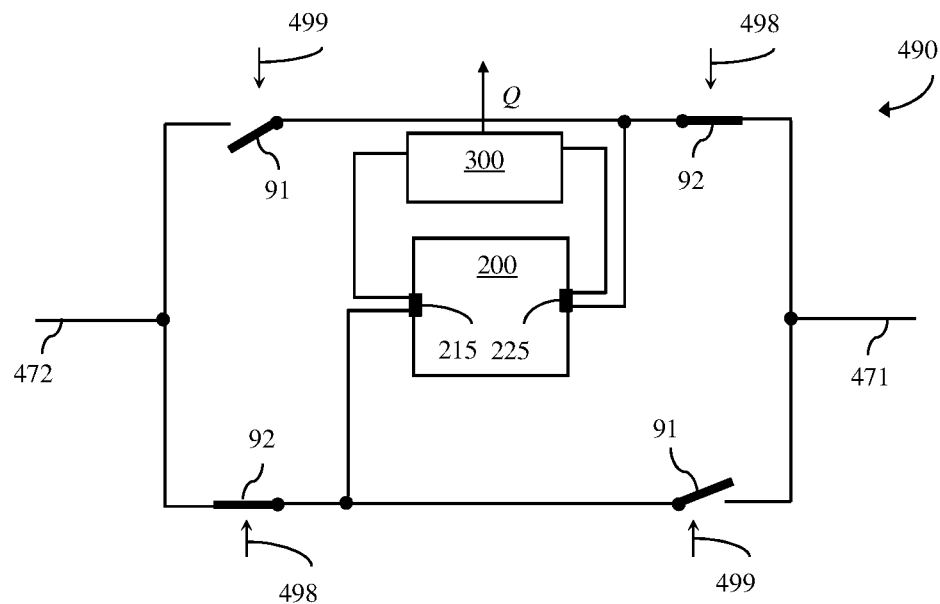

It should be noted that in this embodiment of the memory circuit 500 (or 500') the data and reference inputs are supplied indirectly to each skewed sense amplifier 200 from the corresponding read bitlines (without requiring steering through a steering circuit as in the memory circuit 400 of FIG. 4). As a result, the data input/output nodes 215 and the reference input/output nodes 225 of the two skewed sense amplifiers 200(1)-200(2) in a given pair 590 of skewed sense amplifiers within the sensing circuit 503 may be sufficiently pre-charged when the corresponding read bitlines 571-572 in the memory arrays 581-582 are pre-charged as the start of the single-ended read operation. Thus, the skewed sense amplifiers 200(1)-200(2) may not require the optional integrated pre-charge sub-circuit 240, as described above and illustrated FIG. 2.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory circuit comprising:
    an integrated pair of memory banks comprising:
        a first memory bank comprising a first memory array with first read bitlines; and
        a second memory bank comprising a second memory array with second read bitlines, wherein the first memory bank and the second memory bank are alternately and selectively operable such that at any given time one of the first memory bank and the second memory bank is an active memory bank with an active memory array and a different one of the first memory bank and the second memory bank is an inactive memory bank with an inactive memory array; and
    a sensing circuit between and connected to the first memory array and the second memory array and comprising skewed sense amplifiers for performing sensing processes during single-ended read operations,
    wherein each skewed sense amplifier is configured to receive a data input on data input/output node from a read bitline in the active memory array and a reference input on a reference input/output node from a corresponding read bitline in the inactive memory array and to process the data input and the reference input to determine a stored data value within a selected memory cell that is connected to the read bitline in the active memory array,
    wherein each skewed sense amplifier includes (i) two or more first transistors connected in series between the data input/output node and a first terminal, and (ii) one of more second transistors connected in series between the reference input/output node and the first terminal, and
    wherein a quantity of the two or more first transistors is greater than a quantity of the one or more second transistors.

2. The memory circuit of claim 1,
    wherein the sensing circuit further comprises steering circuits connected to the skewed sense amplifiers, respectively, and
    wherein each steering circuit for each skewed sense amplifier comprises sets of switches that selectively connect one read bitline of the active memory array to the data input/output node and one corresponding read bitline in the inactive memory array to the reference input/output node.

3. The memory circuit of claim 1, wherein each skewed sense amplifier further comprises:
    a switch having the first terminal and a second terminal and being controllable by a sense amplifier set signal,
        wherein the two or more first transistors are n-type transistors connected in series between the data input/output node and the first terminal of the switch,
        wherein the one or more second transistors are n-type transistors connected in series between the reference input/output node and the first terminal of the switch,
        wherein each gate of the two or more first n-type transistors is connected to the reference input/output node,
        wherein each gate of the one or more second n-type transistors is connected to the data input/output node, and
        wherein the second terminal of the switch is connected to a ground or negative voltage rail; and
    a pre-charge sub-circuit comprising:
        a first p-type transistor connected between a positive voltage rail and the data input/output node;
        a second p-type transistor connected between the positive voltage rail and the reference input/output node, wherein a gate of the first p-type transistor is connected to a drain of the second p-type transistor and wherein a gate of the second p-type transistor is connected to a drain of the first p-type transistor; and
        three connected p-type transistors controlled by a sense amplifier reset signal and having a first end node connected to a source of the first p-type transistor, a second end node connected to a source of the second p-type transistor, and intermediate nodes connected to the drain of the first p-type transistor and the drain of the second p-type transistor, respectively.

4. The memory circuit of claim 3, wherein each skewed sense amplifier further comprises a sense assist sub-circuit comprising: a third n-type transistor and an additional third n-type transistor connected in series between the reference input/output node and the first terminal of the switch, wherein a gate of the third n-type transistor is connected to the data input/output node and a gate of the additional third n-type transistor is controlled by a sense assist enable signal.

5. The memory circuit of claim 3,
    wherein initiation of a read operation to determine a stored data value in a selected memory cell in the active memory array comprises, in sequence, performing pre-charging processes so that the read bitline for the selected memory cell, the corresponding read bitline in the inactive memory array, and the data input/output node and the reference input/output node of the skewed sense amplifier are pre-charged to a high voltage state, activating a read wordline for the selected memory cell and controlling a steering circuit connected to the skewed sense amplifier so that the data input from the read bitline in the active memory array is applied to the data input/output node of the skewed sense amplifier and so that the reference input from the corresponding read bitline in the inactive memory array is applied to the reference input/output node of the skewed sense amplifier, and further turning on the switch of the skewed sense amplifier to initiate a sensing process,
    wherein, upon initiation of the sensing process, the reference input/output node has the high voltage state and the data input/output node has either the high voltage state or a discharging voltage state, and wherein the two or more first transistors and the one or more second n-type transistors enable detection of the high voltage state or the discharging voltage state of the data input/output node.

6. The memory circuit of claim 5, wherein, if, upon the initiation of the sensing process, the reference input/output node and the data input/output node both have high voltage states, then the high voltage state is applied to each gate of the two or more first transistors and the one or more second n-type transistors and, as a result of a difference between a slower first current flow rate through the two or more first n-type transistors and a faster second current flow rate through the one or more second n-type transistors, the reference input/output node is pulled down to a low voltage state relatively fast causing the two or more first n-type transistors to turn off and ensuring that the data input/output node remains at the high voltage state and a first stored data value is indicated, wherein, if, upon the initiation of the sensing process, the reference input/output node has the high voltage state and the data input/output node has the discharging voltage state, then the high voltage state is applied to each gate of the two or more first n-type transistors only and the discharging voltage state is applied to each gate of the one or more second n-type transistors and, as a result, the data input/output node is pulled down to the low voltage state and the reference input/output node remains at the high voltage state and a second stored data value is indicated, wherein the sensing circuit further comprises latches connected to corresponding skewed sense amplifiers, respectively, wherein each latch has inputs connected to the data input/output node and the reference input/output node, respectively, of a corresponding skewed sense amplifier, and wherein each latch has an output connected by a corresponding global read bitline to input/output buffers.

* * * * *